though, Leics., England, 9-11, Sept. 1975, A Linear Op-to-Isolator, Morrison et al., pp. 117-126.

United States Patent [19]
Jones

[11] 4,140,914
[45] Feb. 20, 1979

[54] ISOLATED SIGNAL CONDITIONER

[75] Inventor: William R. Jones, Tulsa, Okla.

[73] Assignee: Phillips Petroleum Company, Bartlesville, Okla.

[21] Appl. No.: 864,116

[22] Filed: Dec. 23, 1977

[51] Int. Cl.² .............................................. G11C 27/02
[52] U.S. Cl. .................................... 250/551; 250/205; 307/353
[58] Field of Search ................. 250/551, 205; 307/353

[56] References Cited
U.S. PATENT DOCUMENTS

| | | | |
|---|---|---|---|
| 3,428,828 | 2/1969 | Korzekwa et al. | 307/353 |
| 3,516,002 | 6/1970 | Hillis | 250/551 |
| 3,772,514 | 11/1973 | Sunderland | 250/551 |
| 3,866,051 | 2/1975 | Shearer et al. | 250/551 |
| 4,053,799 | 10/1977 | Minami | 307/353 |

OTHER PUBLICATIONS

Electronics, A. Nielsen, May 15, 1975, pp. 98, 99.
Conference on Hybrid Micro Electronics, Loughborough, Leics., England, 9-11, Sept. 1975, A Linear Opto-Isolator, Morrison et al., pp. 117-126.

Primary Examiner—John Kominski

[57] ABSTRACT

An isolated signal conditioning circuit is provided whereby control or measurement circuitry is isolated from a load, such as a control instrument, through the use of optical isolation and a switching relay. Optical isolation is utilized to isolate the input signal produced by the control or measurement circuitry, from the load. The switching relay isolates a feedback circuit utilized to insure that the signal supplied to the load is an accurate representation of the input signal produced by the control or measurement circuitry.

7 Claims, 1 Drawing Figure

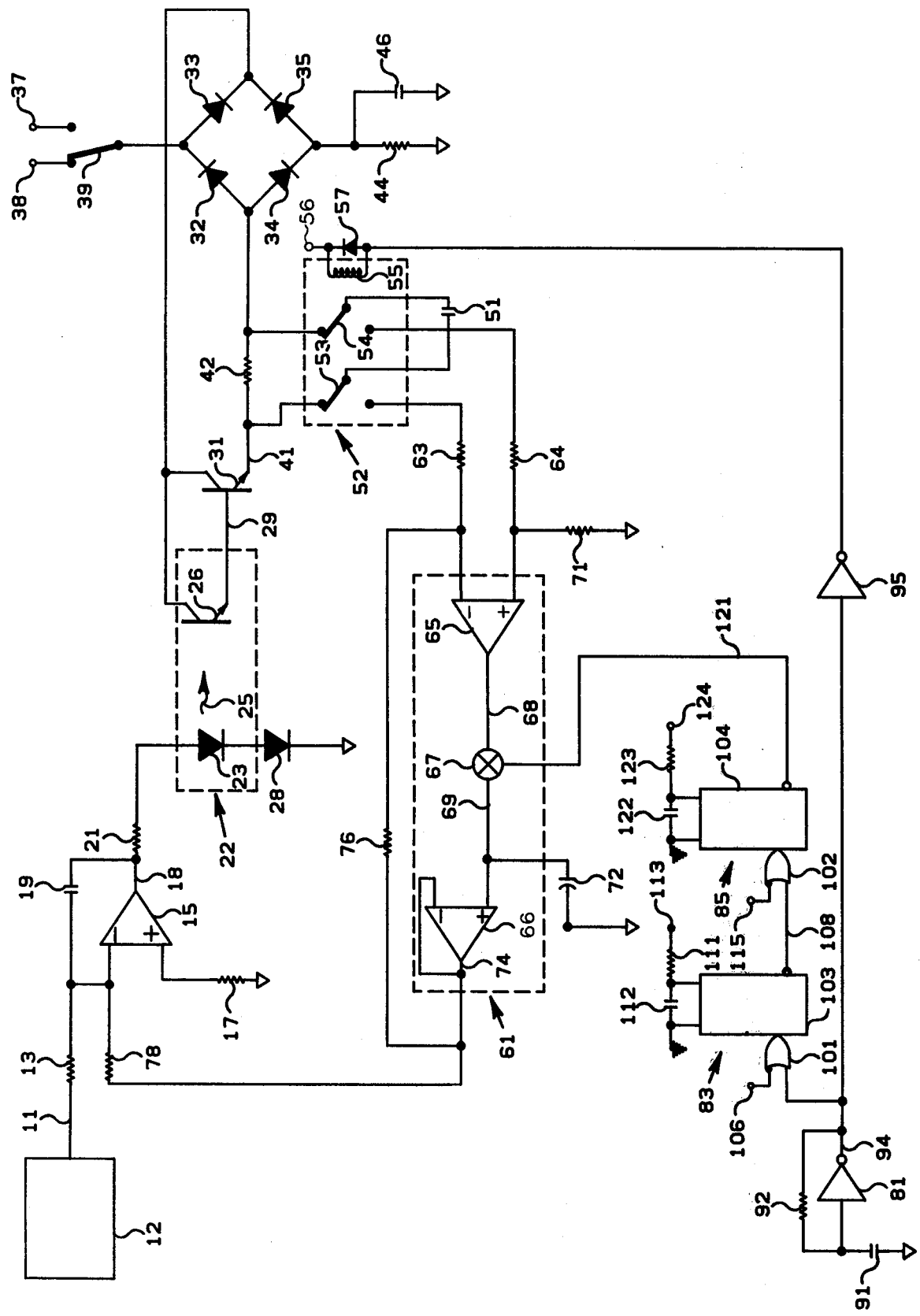

ISOLATED SIGNAL CONDITIONER

This invention relates to signal conditioning. In a particular aspect this invention relates to method and apparatus for conditioning an input electrical signal to provide an output electrical signal which can be received by different types of loads. In another particular aspect this invention relates to method and apparatus for isolating electrical circuits.

In various types of electrical measuring and control systems, there is a need to establish an output electrical signal which is representative of a measured or computed signal. For example, an automatic process control system may utilize a digital computer to calculate the desired setting of a process variable. The digital output signal from the computer is converted to a corresponding analog signal which is capable of being received by a conventional control instrument. However, the output signal from a digital-to-analog converter usually is an extremely small current so that amplification is necessary in order for the output signal to be utilized by the control instrument. Since control instruments of various configurations may be employed in plant operations, it is desirable to provide current amplifying apparatus which is capable of establishing output control signals which can be received by different types of control instruments.

Accordingly, it is an object of this invention to provide a method and apparatus for conditioning an input electrical signal to provide an output electrical signal which can be received by different types of loads.

It is highly desirable to isolate the control or measurement circuitry from the loads such as control instruments. Isolation allows the signal conditioning circuitry and the control or measurement circuitry to operate in a harsher electrical environment.

Accordingly, a second object of this invention is to provide a method and apparatus for isolating electrical circuits.

In accordance with the present invention method and apparatus are provided whereby an electrical input signal is optically isolated from a current amplification circuit which forms a current loop. The electrical current signal, which is representative of the electrical input signal, is supplied across a sense resistor to a load such as a control instrument. If the electrical current signal is not a proper representation of the electrical input signal, the difference is detected and the current signal will be driven to a correct value. This is done by connecting a capacitor across the sense resistor and allowing the capacitor to become charged. The capacitor is then switched to a sample-and-hold circuit which provides a feedback to the input of the conditioning circuit where the electrical input signal was introduced. This feedback forces the electrical current signal to the proper value. The feedback circuit is isolated because of the switch utilized to switch the capacitor from across the sense resistor to the inputs of the sample-and-hold circuit.

Additional objects and advantages of the invention will be apparent from the following description of a preferred embodiment of the invention as illustrated by the drawings in which the sole drawing is a schematic of a signal conditioning circuit which provides isolation between a control or measurement system and a load such as a control instrument.

The invention is described in terms of a preferred embodiment wherein a particular circuit is utilized. Many different circuit configurations are possible which are functionally similar to the circuit configuration illustrated in FIG. 1. For the sake of convenience, power supplies and power levels required by the various chips shown in FIG. 1 have not been shown or specified. Power levels required by the chips are specified by the manufacturers and are well known to those familiar with the art.

Referring now to the drawing, signal 11 which is representative of a control or measurement signal, is provided from the digital-to-analog converter 12 to the inverting terminal of operational amplifier 15 through resistor 13. The noninverting terminal of operational amplifier 15 is grounded through resistor 17. The output signal 18 from operational amplifier 15 is fed back to the inverting terminal of operational amplifier 15 through capacitor 19. The output signal 18 is also supplied as an input to the optical isolating circuit 22 through resistor 21. The output signal 18 drives the light emitting diode 23 in such a manner that a light signal 25 representative of output signal 18 is supplied to the base of the photo transistor 26. The light emitting diode 23 is grounded through diode 28. The emitter of the photo transistor 26 supplies an electrical current signal 29 to the base of transistor 31. The collectors of photo transistor 26 and transistor 31 are tied through the bridge network made up of diodes 32-35 to either power supply 37 or power supply 38 depending on the position of switching means 39. In this preferred embodiment, power supply 38 supplies +15 volts and power supply 37 supplies −15 volts. Signal 41 is supplied from the emitter of transistor 31 through a sense resistor 42 and the bridge network made up of diodes 32-35 to a load 44 such as a control instrument. The load 44 may be remotely located. Signal 41 is also supplied through sense resistor 42 and the bridge network made up of diodes 32-35 to ground through capacitor 46.

The capacitor 51 is connected across the sense resistor 42 by relay means 52. Relay means 52 is made up of switching means 53 and 54 and coil 55. A transient suppression diode 57 is connected across the terminals of coil 55. The cathode side of diode 57 together with one side of coil 55 are tied to a +5V power supply 56. When switching means 53 and 54 of relay 52 are in the alternative position to that shown in the figure, the capacitor 51 is connected to the input terminals of a sample-and-hold circuit 61 through resistors 63 and 64. The sample-and-hold circuit 61 is made up of operational amplifiers 65 and 66 and a sample-and-hold control 67. The noninverting terminal of operational amplifier 65 is grounded through resistor 71. The output signal 68 from operational amplifier 65 is supplied to the sample-and-hold control 67. The output signal 69 from the sample-and-hold control 67 is supplied to the noninverting terminal of operational amplifier 66. Output signal 69 is connected to ground through capacitor 72. The output signal 74 from operational amplifier 66 is fed back to the inverting terminal of operational amplifier 66. The output signal 74 is also fed back to the inverting terminal of operational amplifier 65 through resistor 76. The output signal 74 from operational amplifier 66 is also supplied to the inverting terminal of operational amplifier 15 through resistor 78. The timing signals for the sample-and-hold circuit 61 and the relay 52 are supplied by the oscillator 81 and the monostable multivibrator circuits 83 and 85. The input of the oscillator 81 is grounded through capacitor 91. The inverted output signal 94 from the oscillator 81 is fed back to the input terminal of the oscillator 81 through resistor 92. The output signal 94, which is a square wave having a period which is determined by the values of capacitor 91 and resistor 92, is also supplied through a driver 95 to the coil 55. The output signal 94 provides the timing signal for the relay 52.

The monostable multivibrators, which are commonly known as one-shots, are made up of OR gates 101 and 102 and flip-flops 103 and 104. The output signal 94 from the oscillator 81 is provided as an input to one of the input terminals of OR gate 101. The second terminal of OR gate 101 is tied to a power supply 106 which, in this preferred embodiment, is a +5 volt power supply. The second input terminal of the OR gate 101 is inverted as shown in FIG. 1. The output of the OR gate 101 is supplied as an input to the flip-flop 103. The output signal 108 from flip-flop 103 is inverted and is supplied to one input terminal of OR gate 102. The output signal 108 is a square pulse having a duration determined by the values of resistor 111 and capacitor 112. A power supply 113 which, in this preferred embodiment, is a +5 volt power supply is tied to the flip-flop 103 through resistor 111. The second input terminal of OR gate 102 is tied to a power supply 115 which, in this preferred embodiment, is a +5 volt power supply. The output signal from OR gate 102 is supplied to the flip-flop 104. The output signal 121 from flip-flop 104 is supplied as a timing signal to the sample-and-hold control 67. The output signal 121 is a square pulse having a duration determined by the value of capacitor 122 and resistor 123. Power supply 124 which is a 5-volt power supply is tied to the flip-flop 104 through resistor 123.

The optical isolation circuit 22 provides optical isolation between the controlling circuitry represented by digital-to-analog converter 12 and the signal conditioning circuit and load, such as a control instrument, which is represented by resistor 44. The relay 52 provides isolation for the feedback loop utilized to insure that the electrical signal 41 is representative of the input electrical signal 11.

Operational amplifier 15 functions as a summing and smoothing amplifier. The photo transistor 26 and transistor 31 provide current amplification for the output signal 18 from operational amplifier 15. The bridge network made up of diodes 32-35 allows current to flow in the same direction through transistor 31 and resistor 42 regardless of whether power supply 37 or power supply 38 is utilized. The +15 volt power supply 38 is utilized if the current loop is to act as a current source. The −15 volt power supply 37 is utilized if the current loop is to act as a current sink. The size of the sense resistor 42 determines the current which will flow to the load 44. In this preferred embodiment, a 50 ω sense resistor is used to provide a 4-20 ma current flow to the load 44 and a 20 ω sense resistor is used when a 10-50 ma current flow is desired.

The current flowing to the load 44 is forced to a correct value representative of signal 11 by the feedback circuit. When the capacitor 51 is connected across the sense resistor 42, it is charged to a voltage representative of the voltage drop across the sense resistor 42. When the capacitor 51 is then switched to the sample-and-hold circuit 61 by the relay 52, an output signal 74 is formed which is representative of the voltage drop across the sense resistor multiplied by the gain of the sample-and-hold circuit 61. The output signal 74 is applied to the summing junction of operational amplifier 15. If the absolute value of signal 74 is less than the absolute value of signal 11, then the light emitting diode 23 will be driven harder, which will turn on photo transistor 26 and transistor 31 to a greater degree, causing more current to flow in the current loop. If the absolute value of signal 74 is greater than the absolute value of signal 11, then the light emitting diode 23 will be driven less, which will cause a resultant decrease in the current flow in the current loop. Steady state is reached when the absolute value of signal 74 is equal to the absolute value of signal 11, signifying that the current flowing in the current loop is a correct representation of signal 11 from the digital-to-analog converter 12.

Signal 94 from the oscillator 81 provides a timing signal to switch relay 52. Signal 121 from the one-shot 85 is provided as a control signal for the sample and hold circuit 61. Both signal 94 and signal 121 are free running, which allows updating of the feedback signal 74 at regular intervals.

In this preferred embodiment, the oscillator 81 is an MM 74C14 hex Schmitt trigger manufactured by National Semiconductor. The output signal 94 from the oscillator 81 is a square wave having a period determined by $$T = RC \ln\left(\frac{V_{T+}}{V_{T-}}\right) + RC \ln\left(\frac{V_{cc} - V_{T-}}{V_{cc} - V_{T+}}\right)$$

where
T = period of the square wave;
R = resistance in ohms of resistor 92;
C = capacitance in farads of capacitor 91;
ln = natural logarithm;
$V_{T+}$ = positive going threshold voltage;
$V_{T-}$ = negative going threshold voltage; and
$V_{cc}$ = supply voltage.

In this preferred embodiment, R is 15 Kω and C is 1 μfd. $V_{T+}$ has a typical value of 3.6 volts, $V_{T-}$ has a typical value of 1.4 volts, and $V_{cc}$ is +5 volts. Solving for T gives a value of 28.32 msec.

In this preferred embodiment, the one-shots 103 and 104 and the OR gates 101 and 102 are MC14538BCP Dual Precision Retriggerable/Resettable Monostable Multivibrators manufactured by Motorola Semiconductors. The output signals 108 and 121 from the one-shots are pulses having durations determined by $$T = RC$$

where
T = duration of the pulse;
R = resistance in ohms of resistor 111 or resistor 123;
and C = capacitance in farads of capacitor 112 or capacitor 122

In this preferred embodiment, resistor 111 is 10 Kω and capacitor 112 is 0.33 μfd. Solving for T gives a value of 3.3 msec. for signal 108. Resistor 123 is 5 Kω and capacitor 122 is 0.033 μfd. Solving for T gives a value of 0.165 msec. for signal 121.

The relay 52 switches the capacitor from across the resistor 42 to the input of the sample-and-hold circuit 61 on the rising edge of signal 94 which is inverted by driver 95. The one-shot 83 is also triggered on the leading edge of signal 94. The relay 52 typically takes 1.25 msec. to perform the switching operation. The 3.3 msec. pulse width of signal 108 delays the triggering of one-shot 85 while the switching is taking place and allows the relay to settle. At the end of 3.3 msec. the one-shot 85 will be triggered and signal 121, having a pulse duration of 0.165 msec., is supplied to the sample-and-hold circuit 61. The sample-and-hold circuit is in the sample mode for 0.165 msec. during which capacitor 72 assumes the voltage level of capacitor 51. At the end of the 0.165 msec. period, the sample-and-hold circuit returns to the hold mode. The capacitor 51 is then switched back to resistor 42 by relay 52 and the cycle is repeated. The timing cycle insures that the feedback loop is isolated and insures that switching transients will not interfere with the sampling function. Many different timing arrangements are possible which would perform the desired functions. The timing cycle set forth above is utilized in the preferred embodiment of this invention but could be easily varied by those familiar with the art.

The invention has been described in terms of its presently preferred embodiment as is shown in FIG. 1. Specific components which are available and which can be used in the practice of the invention as shown in FIG. 1 follow. Values of resistors and capacitors used in the circuit are also given. It should be recognized that different types of solid state devices could be utilized. Also many different combinations of capacitance values and resistor values are possible.

| Component | Value | Part |
|---|---|---|
| Resistor 13, 78, 111 | 10 KΩ | TRW/IRC RN55D |
| Resistor 17 | 2.5 KΩ | TRW/IRC RN55D |
| Resistor 42 | 50Ω 20Ω | TRW/IRC RN55D |
| Resistor 63, 64 | 100 KΩ | TRW/IRC RN55D |
| Resistor 71, 76 | 500 KΩ | TRW/IRC RN55D |
| Resistor 123 | 5 KΩ | TRW/IRC RN55D |
| Resistor 92 | 15 KΩ | TRW/IRC RN55D |
| Capacitor 19 | 5.6 μfd | Sprague, 196D565X9025WA2 |
| Capacitor 51 | 100 μfd | Sprague, 109D107X0025F2 |
| Capacitor 72 | 0.01 μfd | Mallory, SXM110 |
| Capacitor 46 | 0.01 μfd | Sprague, 5GA-S10 |
| Capacitor 122 | 0.033 μfd | Sprague, 225P33391WD3 |
| Capacitor 112 | 0.33 μfd | Sprague, 196D334X9035HA1 |
| Capacitor 91 | 1 μfd | Sprague, 196D105X9050HA1 |
| Diode 28, 57 | | IN 914, Fairchild Semiconductor |
| Diodes 32, 33, 34, 35 | | MDA920A Diode Assembly Motorola |
| Relay 52 | | HGJ2MT54211 G00 Mercury relay, 2 Form C, C. P. Clare & Co. |
| Operational Amplifier 15 | | AD 510, Analog devices |
| Optical Isolator 22 | | 4N33, Motorola |
| Sample-and-hold 61 | | HA-2425, Harris Semiconductor |
| One-Shots 83, 85 | | MC14538B Dual Precision Retriggerable/Resettable Monostable Multivibrator Motorola Semiconductor |
| Schmitt trigger 81 | | MM74C14, National Semiconductor |
| Display driver 95 | | DS75492 Hex Digit Driver National Semiconductor |
| Transistor 31 | | MPS-UO6, NPN Amplifier Transistor Motorola Semiconductor |

While the invention has been described in terms of the presently preferred embodiment, reasonable variations and modifications are possible by those skilled in the art, within the scope of the described invention and the appended claims.

That which is claimed is:

1. Apparatus comprising:
   an optical isolation means;
   means for supplying a first electrical signal to the input of said optical isolation means;
   current amplification means;
   means for supplying a second electrical signal, which is representative of said first electrical signal, from the output of said optical isolation means to the input of said current amplification means;
   a resistor;
   means for supplying said second electrical signal, which has been amplified from the output of said current amplification means to said resistor;
   a capacitor;
   a sample and hold means;
   means for connecting said capacitor across said resistor in such a manner that said capacitor will be charged to the voltage, across said resistor, produced by said second electrical signal which has been amplified;
   means for switching said capacitor, when it is charged to the voltage across said resistor, to the input of said sample-and-hold means in such a manner that said capacitor can never be connected across said resistor and to the input of said sample-and-hold means at the same time; and
   means for supplying a third electrical signal, which is representative of said second electrical signal, which has been amplified from the output of said sample-and-hold means to said means for supplying a first electrical signal to the input of said optical isolation means in such a manner that, if said second electrical signal which has been amplified is not a correct representation of said first electrical signal, the input to said optical isolation means will be varied to force said second electrical signal to a new value which will cause said second electrical signal, which has been amplified to be a more accurate representation of said first electrical signal.

2. Apparatus in accordance with claim 1 additionally comprising:
   a diode bridge;
   a load; and
   means for supplying said second electrical signal, which has been amplified through said resistor and said diode bridge to said load.

3. Apparatus in accordance with claim 1 additionally comprising:
   means for generating a periodically pulsating fourth electrical signal having a period $T_1$;
   means for supplying said fourth electrical signal to said means for switching said capacitor to control the switching operation;
   means for generating a periodically pulsating fifth electrical signal having a period $T_2$, in response to said fourth electrical signal;

means for generating a periodically pulsating sixth electrical signal having a period $T_3$, in response to said fifth electrical signal, in such a manner that said sixth electrical signal is delayed with respect to said fourth electrical signal by a time given by said period $T_2$; and means for supplying said sixth electrical signal to said sample-and-hold means in such a manner that said sample-and-hold means is placed in a sample mode for said period $T_3$, after said capacitor has been switched to the input of said sample-and-hold means, and is returned to a hold mode at the end of said period $T_3$, before said capacitor is switched back across said resistor.

4. A method for providing isolation between electrical circuits comprising the steps of:
  supplying a first electrical signal to the input of an optical isolation means;
  supplying a second electrical signal which is representative of said first electrical signal from the output of said optical isolation means to the input of a current amplification means;
  supplying the second electrical signal, which has been amplified from the output of said current amplification means to a resistor;
  connecting a capacitor across said resistor in such a manner that said capacitor will be charged to the voltage, across said resistor, produced by said second electrical signal which has been amplified;
  switching said capacitor, when it is charged to the voltage across said resistor, to the input of a sample-and-hold means in such a manner that said capacitor can never be connected across said resistor and to the input of said sample-and-hold means at the same time; and
  supplying a third electrical signal, which is representative of said second electrical signal which has been amplified, from the output of said sample-and-hold means; said combining said first electrical signal and said third electrical signal in such a manner that, if said second signal which has been amplified is not a correct representation of said first electrical signal, the input to said optical isolation means will be varied to force said second electrical signal to a new value which will cause said second electrical signal which has been amplified to be a more accurate representation of said first electrical signal.

5. A method in accordance with claim 4 comprising the additional step of supplying said second electrical signal which has been amplified through said resistor and a diode bridge to a load.

6. A method in accordance with claim 4 comprising the additional steps of:
  producing a periodically pulsating fourth electrical signal having a period $T_1$;
  utilizing said fourth electrical signal to control the switching of said capacitor from across said resistor to the input of said sample-and-hold means;
  producing a periodically pulsating fifth electrical signal having a period $T_2$ in response to said fourth electrical signal;
  producing a periodically pulsating sixth electrical signal having a period $T_3$, in response to said fifth electrical signal, in such a manner that said sixth electrical signal is delayed with respect to said fourth electrical signal by a time given by said period $T_2$; and
  supplying said sixth electrical signal to said sample-and-hold means in such a manner that said sample-and-hold means is placed in a sample mode for said period $T_3$, after said capacitor has been switched to the input of said sample-and-hold means, and is returned to a hold mode at the end of said period $T_3$, before said capacitor is switched back across said resistor.

7. A method for providing isolation between electrical circuits comprising the steps of:
  producing a light beam in response to a first electrical signal;
  producing, in response to said light beam, a second electrical signal which is representative of said first electrical signal;
  amplifying said second electrical signal to produce a third electrical signal;
  intermittently sampling said third electrical signal, to produce a fourth electrical signal which is representative of said third electrical signal, in such a manner that said third electrical signal is electrically isolated from said fourth electrical signal; and
  utilizing said fourth electrical signal to vary the intensity of said light beam, if said third electrical signal is not a correct representation of said first signal, in such a manner that said third electrical signal will assume a new value which will be a more accurate representation of said first electrical signal.

* * * * *